US011431559B2

(12) United States Patent
Crawford

(10) Patent No.: US 11,431,559 B2
(45) Date of Patent: Aug. 30, 2022

(54) COOLING SYSTEM FOR DATA CENTER RACK

(71) Applicant: Vapor IO Inc., Austin, TX (US)

(72) Inventor: Colton Malone Crawford, Austin, TX (US)

(73) Assignee: Vapor IO Inc., Austin, TX (US)

(*) Notice: Subject to any disclaimer, the term of this patent is extended or adjusted under 35 U.S.C. 154(b) by 208 days.

(21) Appl. No.: 15/797,421

(22) Filed: Oct. 30, 2017

(65) Prior Publication Data

US 2018/0070476 A1  Mar. 8, 2018

Related U.S. Application Data

(63) Continuation of application No. 15/065,201, filed on Mar. 9, 2016, now Pat. No. 9,839,162.

(60) Provisional application No. 62/275,909, filed on Jan. 7, 2016, provisional application No. 62/248,788, filed on Oct. 30, 2015, provisional application No. 62/130,018, filed on Mar. 9, 2015.

(51) Int. Cl.
*H05K 7/20* (2006.01)
*H05K 7/14* (2006.01)
*G06F 1/30* (2006.01)
*H04L 41/0803* (2022.01)

(52) U.S. Cl.
CPC .......... *H04L 41/0803* (2013.01); *G06F 1/305* (2013.01); *H05K 7/1492* (2013.01); *H05K 7/1497* (2013.01); *H05K 7/20145* (2013.01); *H05K 7/20736* (2013.01); *H05K 7/20745* (2013.01)

(58) Field of Classification Search
CPC ............ H05K 7/1492; H05K 7/20736; H05K 7/20145; G06F 1/305
USPC ........................................................ 454/184
See application file for complete search history.

(56) References Cited

U.S. PATENT DOCUMENTS

| 7,508,663 | B2 * | 3/2009 | Coglitore ........... H05K 7/20736 165/122 |
|---|---|---|---|
| 2004/0255286 | A1 | 12/2004 | Rothman |
| 2006/0212691 | A1 | 9/2006 | Wood |
| 2008/0244282 | A1 | 10/2008 | Hansalia |
| 2010/0302754 | A1 | 12/2010 | Nordin |
| 2010/0317278 | A1* | 12/2010 | Novick ............... F24F 11/0001 454/184 |
| 2012/0082462 | A1 | 4/2012 | Mariotti |
| 2013/0013759 | A1 | 1/2013 | Austen |

(Continued)

OTHER PUBLICATIONS

Notice of Allowance in related U.S. Appl. No. 16/108,978 dated Nov. 2, 2020 (11 pages).

(Continued)

*Primary Examiner* — Allen R. B. Schult
(74) *Attorney, Agent, or Firm* — Pillsbury Winthrop Shaw Pittman, LLP

(57) ABSTRACT

Provided is a process for cooling a datacenter chamber having racks configured to hold arrays of rack-mounted computing devices, the process including: directing a cooling fluid, at a first temperature and a first pressure from an outer radius of circularly arranged racks through the racks and components within the racks; passing the cooling fluid to an interior chamber of the datacenter chamber at a second temperature and a second pressure; and directing the cooling fluid upward to exit the interior chamber.

24 Claims, 5 Drawing Sheets

(56) References Cited

U.S. PATENT DOCUMENTS

| | | | |
|---|---|---|---|
| 2013/0027530 A1* | 1/2013 | Li | G06K 7/1439 348/61 |
| 2013/0120931 A1* | 5/2013 | Sankar | H05K 7/20745 361/679.48 |
| 2013/0173810 A1 | 7/2013 | Subramaniam | |
| 2014/0185225 A1 | 3/2014 | Wineland | |
| 2014/0126143 A1 | 5/2014 | Dean | |
| 2014/0250292 A1 | 9/2014 | Edwards | |
| 2015/0043593 A1 | 2/2015 | Snowdon | |
| 2015/0236512 A1* | 8/2015 | Whitney | G06F 13/4068 307/80 |
| 2015/0248315 A1 | 9/2015 | Ragupathi | |
| 2015/0277856 A1 | 10/2015 | Payne | |
| 2016/0070627 A1 | 3/2016 | Huang | |
| 2016/0099886 A1 | 4/2016 | Rao | |
| 2016/0127274 A1 | 5/2016 | Casado | |
| 2016/0164804 A1 | 6/2016 | Mekad | |
| 2016/0203017 A1 | 7/2016 | Davenport | |
| 2016/0350005 A1 | 12/2016 | Yuba | |
| 2018/0035572 A1 | 2/2018 | Song | |

OTHER PUBLICATIONS

Decision to grant a European patent pursuant to Article 97(1) EPC in related European Application No. 16762406.3 (3 pages).

U.S. Non-Final Office Action in related U.S. Appl. No. 16/437,337 dated Feb. 4, 2021 (40 pages).

Office Action in related Indian Application No. 201747034240 dated Apr. 9, 2021 (6 pages).

Non-Final Office Action in related U.S. Appl. No. 16/108,978 dated May 7, 2020 (13 pages).

Final Office Action in related U.S. Appl. No. 15/797,421 dated Jun. 1, 2020 (24 pages).

Notice of Allowance in related U.S. Appl. No. 16/289,572 dated Jun. 2, 2020 (10 pages).

European Office Action in related EP application No. 17 736 454.4 dated Jun. 4, 2020 (9 pages).

Final office action in related U.S. Appl. No. 16/437,337 dated Sep. 22, 2021.

* cited by examiner

COOLING SYSTEM FOR DATA CENTER RACK

CROSS-REFERENCE TO RELATED APPLICATIONS

The present application is a continuation of U.S. patent application Ser. No. 15/065,201, filed on 9 Mar. 2016, which claims the benefit of the following U.S. Provisional Patent Applications: U.S. 62/130,018, filed 9 Mar. 2015; U.S. 62/248,788, filed 30 Oct. 2015; and U.S. 62/275,909, filed 7 Jan. 2016. The entire content of each parent application is incorporated by reference in its entirety.

BACKGROUND

1. Field

The present invention relates generally to cooling systems and, more specifically to cooling systems for computer racks.

2. Description of the Related Art

Computer racks, such as server racks, are generally used to house and in some cases interconnect collections of computing devices, like servers and associated storage, power supplies, network switches and the like. In many cases, the computing devices are relatively numerous and arranged in a relatively high-density array due to the cost of space appropriate to store such computing devices. Often the computing devices generate a relatively large amount of heat during operation, and cooling the computing devices can be energy intensive. Indeed, in many cases, cooling costs account for a substantial portion of the cost of running such devices.

SUMMARY

The following is a non-exhaustive listing of some aspects of the present techniques. These and other aspects are described in the following disclosure.

Some aspects include a method for cooling a datacenter chamber having racks configured to hold arrays of rack-mounted computing devices. The method including: directing a cooling fluid (e.g., air), at a first temperature and a first pressure from an outer radius of circularly arranged racks through the racks and components within the racks; passing the cooling fluid to an interior chamber of the datacenter chamber at a second temperature and a second pressure; and directing the cooling fluid upward to exit the interior chamber.

BRIEF DESCRIPTION OF THE DRAWINGS

The above-mentioned aspects and other aspects of the present techniques will be better understood when the present application is read in view of the following figures in which like numbers indicate similar or identical elements.

Figure 1:
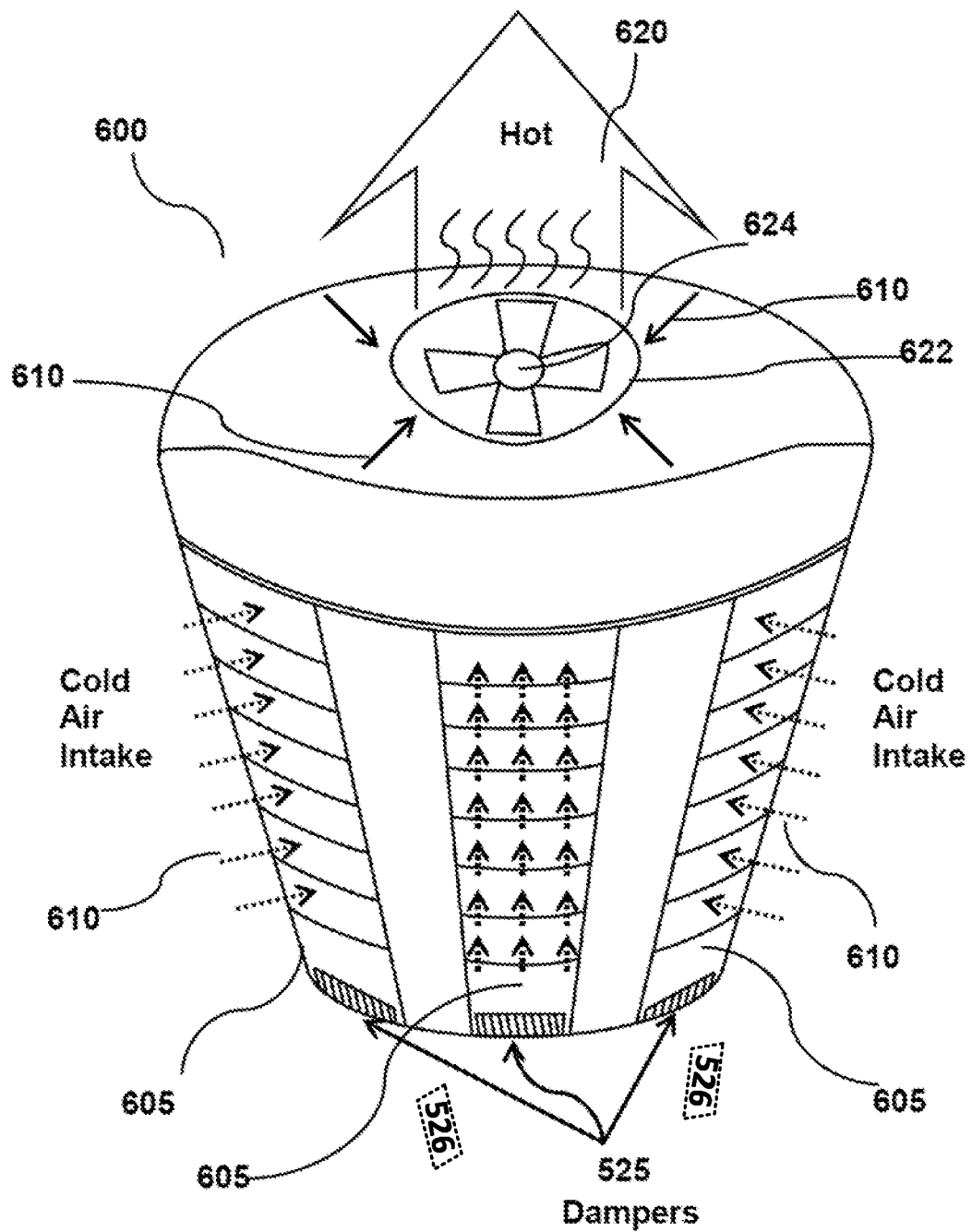
FIG. 1 illustrates operation of a cooling system for a cylindrical computing-device rack.

While the invention is susceptible to various modifications and alternative forms, specific embodiments thereof are shown by way of example in the drawings and will herein be described in detail. The drawings may not be to scale. It should be understood, however, that the drawings and detailed description thereto are not intended to limit the invention to the particular form disclosed, but to the contrary, the intention is to cover all modifications, equivalents, and alternatives falling within the spirit and scope of the present invention as defined by the appended claims.

DETAILED DESCRIPTION OF CERTAIN EMBODIMENTS

To mitigate the problems described herein, the applicants had to both invent solutions and, in some cases just as importantly, recognize problems overlooked (or not yet foreseen) by others in the field. Indeed, applicants wish to emphasize the difficulty of recognizing those problems that are nascent and will become much more apparent in the future should trends in the data center industry continue as applicants expect. Further, because multiple problems are addressed, it should be understood that some embodiments are problem-specific, and not all embodiments address every problem with traditional systems described herein or provide every benefit described herein. That said, improvements that solve various permutations of these problems are described below.

Controlling air temperature in an environment with multiple computing devices is generally done to help protect equipment from malfunction and damage. In some cases it may also reduce power consumption and cost. For example, temperatures in a server rack may rise because of the amount of power used in the server rack, which may cause heat damage to equipment on the rack. Further, high humidity may cause water to condense on internal components within the server rack. And low humidity may cause static electricity discharge problems which may damage components within the server rack. Industry recommended temperatures generally range between 64 and 81° F. in some cases, temperatures may range between 59 and 90° F., a dew point range between 41 and 59° F., and a maximum relative humidity of 60.

Traditional techniques for controlling temperature and humidity in data center racks are lacking. In many cases, a "hot aisle" is used between a pair of racks facing opposite directions, with air flowing through the racks and into the "hot aisle." This arrangement often wastes very valuable floor space in data centers, as the "hot aisle," generally runs along a full length of rows of racks, consuming space that designers would prefer to dedicate to storing computing devices. Further, existing systems for driving a cooling fluid are not particularly reliable or responsive to changing conditions within a datacenter, and some designs are susceptible to positive-pressure in the "hot aisle," possibly causing some computing devices to be heated rather than cooled.

Figure 2:
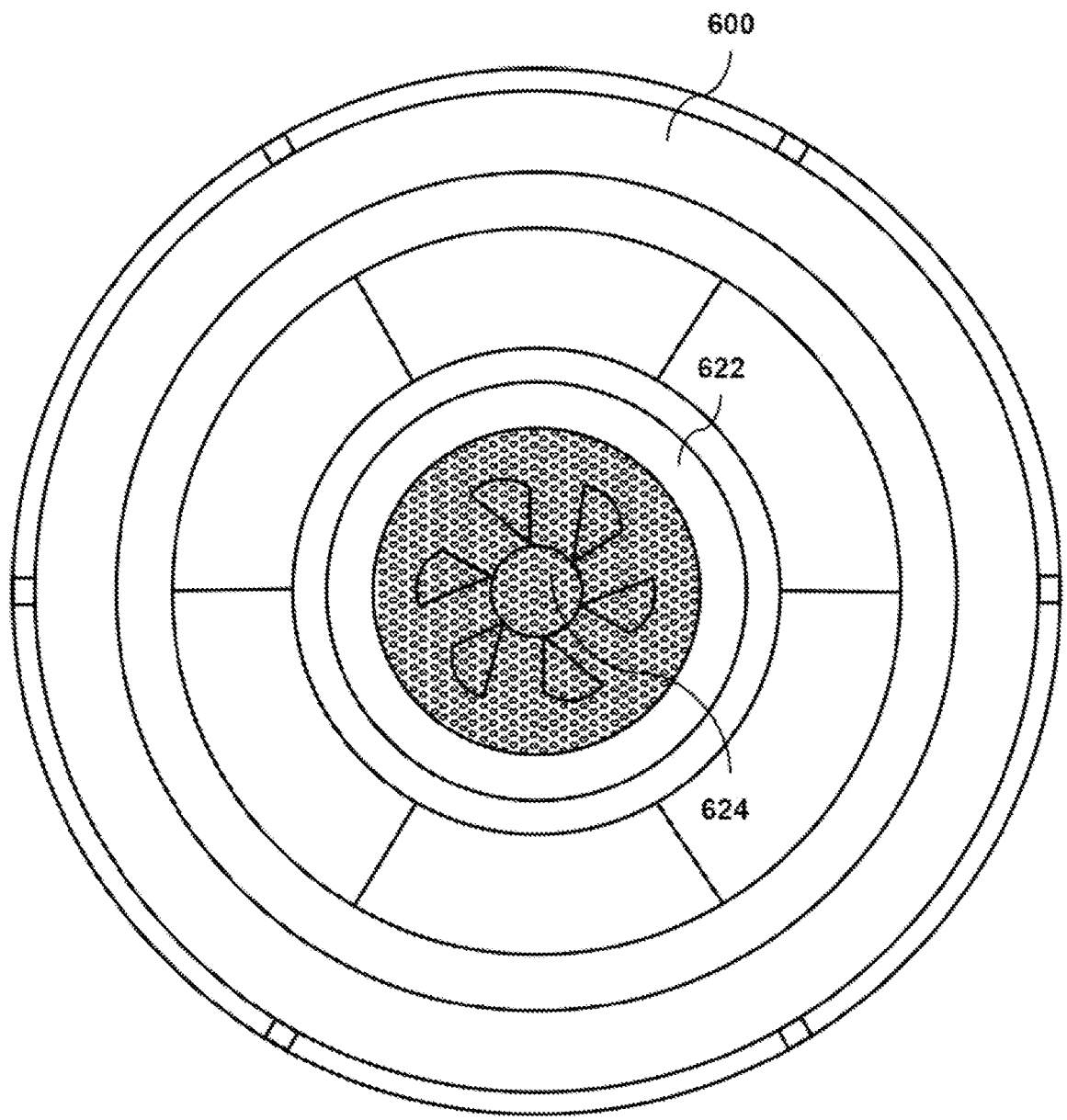
FIG. 2 illustrates components of the cylindrical computing-device rack of FIG. 1.
Figure 3:
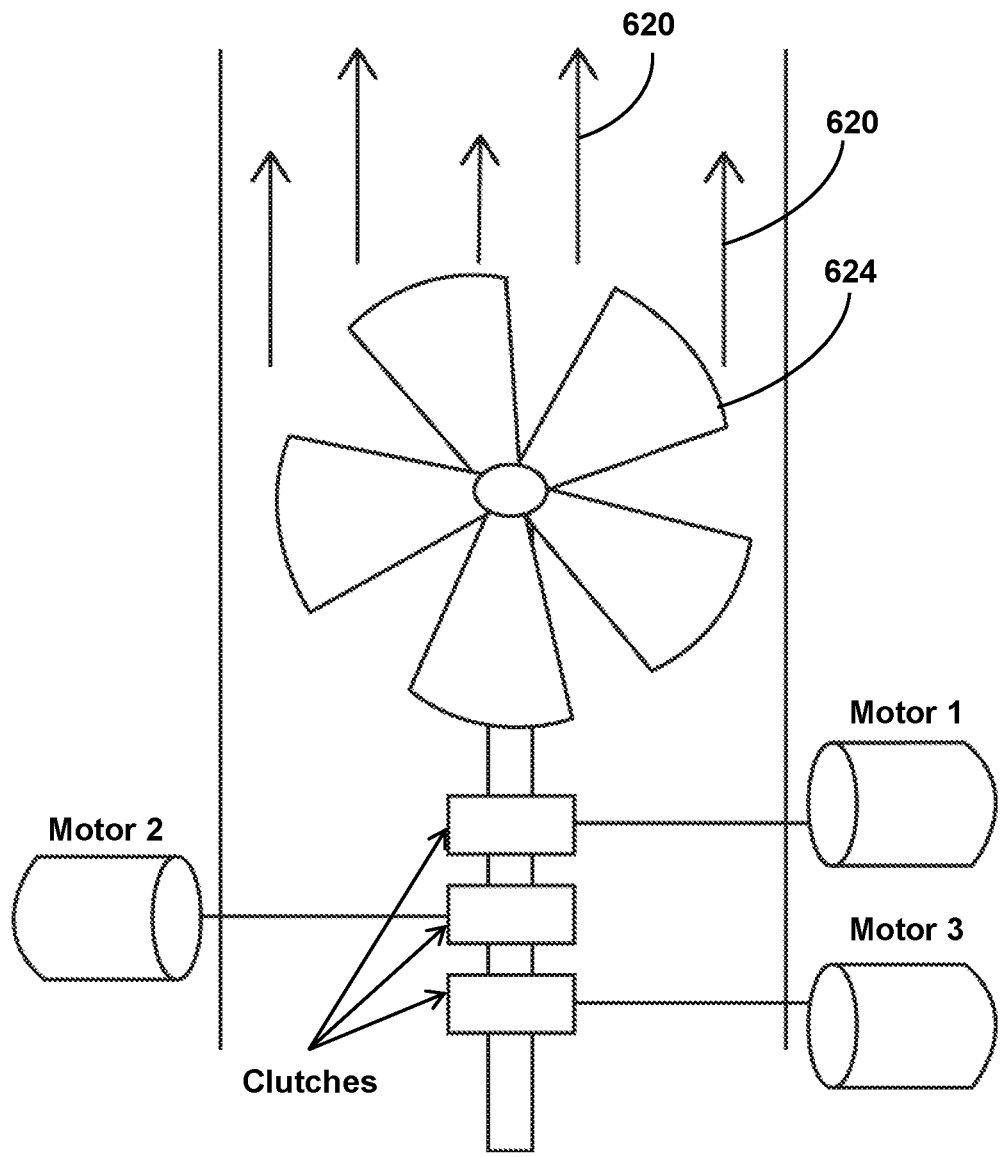
FIG. 3 illustrates operation of a fan in the cylindrical computing-device rack of FIG. 1.

To mitigate some or all of these problems, and others, some embodiments, such as those shown in FIG. 1-3, implement a structure whereby the "hot aisle" is replaced by a hot, generally cylindrical, interior chamber. In some embodiments, cool air is pulled or pushed in from all directions circumferentially inward cool the equipment. The incoming air is heated as it passes across heatsinks and other warm components inside the equipment, pulling waste heat from computing devices, before being exhausted through the interior chamber. In some cases, the hot exhaust from server racks can be more efficiently evacuated while occupying less overall space and increasing computing density. Further, some embodiments may offer varied airflow resistance along the length of the interior chamber, increasing airflow resistance into the interior chamber toward the downstream end of the chamber, to reduce the likelihood of positive pressure developing in the interior chamber. That said, embodiments are not limited to systems that provide these benefits, as various independently useful techniques are described here, which is not to suggest that any other feature may not be omitted in some cases.

The present techniques are described with reference to a cooling gas (air), but are consistent with other fluids, e.g., systems immersed in mineral oil. In some embodiments, an integrated cooling system for cooling a server rack may be independent from other cooling systems (e.g., for other server racks in the datacenter, for the room where the datacenter is located, or for the building where the datacenter is located). In some cases, the integrated cooling system of the server rack may be controlled in concert with other cooling systems for other racks, for the room or for the building. Cooling systems, humidifiers, ventilators, or other temperature and humidity control systems may be used to help control air temperature and humidity. In some embodiments, the integrated cooling system may be configured to provide cooling and humidity control by directly drawing fresh air into the cooling system (e.g., through a vent, duct, etc.) In some embodiments, the integrated cooling system may be a portable cooling system.

In the illustrated embodiment of FIG. 1, server racks 605 of chamber 600 are arranged into a cylindrical shape (or they may be arranged in other shapes e.g., square, hexagon, or octagon with the back sides all facing towards the center). In some embodiments, the chamber 600 may have a generally cylindrical shape, e.g., a circular cylindrical shape. In some embodiments, the chamber 600 may be generally rotationally symmetric about a vertical axis extending through the center of the chamber 600.

In some embodiments, the interior chamber of chamber 600 may generally be of cylindrical shape. In some cases, the interior chamber of chamber 600 may define a cylinder with a base having a variety of shapes consistent with the present techniques, e.g., a rectangular, triangular, pentagonal, hexagonal, heptagonal, octagonal, decagonal, dodecagonal, or elliptical. In some cases, the interior chamber may define a tapered shape, such as an inverted cone, in which the diameter of the bottom is larger than the top or vice versa. This, in some cases, allows outside cold air to be pulled (or pushed) in from several (e.g., all horizontal) directions to cool equipment in chamber 600 as shown by arrows 610. In some cases, hot air is exhausted through the interior chamber, or cool air may be ingested through the interior chamber.

Various techniques may be used for forcing air to flow over computing equipment mounted in the racks, or some embodiments may use convection currents. For example, a cooling fluid (e.g., air, gas, water, chemicals, or other cooling fluids) may be driven along equipment in chamber 600 and through the interior chamber. The cool fluid is heated as it passes through equipment and is driven out of the chamber. For example, in case of air or gas, the heated fluid may be driven out by a fan 624 located near an end of the interior chamber (e.g., top of the interior chamber, or located elsewhere within, and/or near to chamber 600) to a duct or a vent.

Or in the case of cooling liquids, the heated liquid may be directed out of the chamber and into a heat exchanger using a pump. A variety of different types of liquids may be used. In some cases, a liquid that is an insulator may be pumped over the equipment, like mineral oil or distilled water. In some embodiments, liquid cooling may be advantageous. For example, cooling liquids are less influenced by ambient temperature and may have a relatively high thermal conductivity and specific heat allowing transfer of more heat from the parts being cooled. In some cases, using cooling liquids may provide less noise compared to other cooling methods. Cooling gases, however, are expected to offer less expensive cooling systems.

In some embodiments, chamber 600 may include an integrated ventilation infrastructure. In some embodiments, the integrated ventilation infrastructure of chamber 600 is independent of other ventilation systems of other chambers, room, or building, e.g., having its own mechanical drive and apparatus configured to create a pressure differential. For example, the integrated ventilation system may have its own controller, temperature sensors, fan, and motors, such that once power is supplied, the system can provide cooling without further infrastructure. This is expected to facilitate lower cost re-configuration of data centers in response to changes in demand, as capacity can be added without reconfiguring the building. That said, several independently useful inventions are described, so not all embodiments provide all of these benefits.

In some cases, the integrated ventilation infrastructure may be controlled in concert with ventilation of other chambers in the datacenter, ventilation of the room, or building. In some embodiments, the ventilation infrastructure may include one or more fans in series or parallel. In some embodiments, the integrated ventilation infrastructure includes a plurality of motors attached to a fan through clutches.

As shown in FIG. 1, the cold (e.g., relative to the temperature of the computing equipment) air may flow over the computing devices, drawing heat therefrom, and into the interior cylindrical interior chamber (cylinder). From the cylinder, the air may be exhausted through fan 624 that drives the airflow as shown by arrows 620 in FIGS. 1 and 3. In some embodiments, fan 624 is part of an integrated cooling or ventilation system by which air is drawn through the inner chamber and out of the chamber. In some embodiments, ducting may be coupled to the cylinder and air may flow through the ducting to a region at a lower pressure.

In some embodiment, cool air (or other cooling fluid) may be driven along equipment in chamber 600 and through the interior chamber. Different techniques for driving the cool air may be used. For example, the cool air may be forced by a fan (or multiple fans) to flow circumferentially inward or outward to cool rack-mounted computing equipment. In some embodiments, a series of fans each located proximate to an outer surface of a rack may be configured to drive cool air inward and over the equipment. The cool air may be ambient air in some cases. In some embodiments, cool air may be provided by a cooling system for example building heating, ventilation, and air conditioning (HVAC), reversible heat pump, portable air conditioning unit, free cooling system, evaporative cooler, or the like. In some embodiments, when the outside temperature is cool (e.g., night time, cold season, cold location, etc.), outside air may be driven directly into the rack without going through a cooling process. The outside air may be driven by a pump, a blower, a fan, a duct system, or by other guiding mechanisms for drawing air into the rack.

In some embodiments, in operation, cool air (or other cooling fluids) at a first temperature, and a first pressure is directed to flow circumferentially inward along computing devices mounted in the racks of chamber 600 and through the interior chamber of chamber 600. In some cases, the cool air flows through the racks, along and through equipment on the racks. As shown in FIG. 1, the air flows from all directions (e.g., substantially all directions in a horizontal plane) of the cylindrical shaped chamber and is drawn through the racks and equipment on the racks towards the interior chamber. The incoming air is heated as it passes across heatsinks (pulling waste heat from computing equipment) and other warm components inside the equipment, in these embodiments. Heatsinks generally transfer heat from equipment on the rack to the cool air trough convection, radiation, conduction, or other heat transfer methods.

In some embodiments, the hot air exits the backs of the racks and enters the interior chamber. In this example, once in the interior chamber, air is at a temperature that is higher than the first temperature and at a pressure lower than the first pressure. The interior chamber defines a flow path for the heated air, which in this example, exits the chamber through the top side of the chamber.

In some embodiments, chamber 600 may include dampers configured to adjust the flow of air. Dampers may be used to increase, decrease or completely stop the flow of air. FIG. 1 illustrates an example of dampers 525 In some cases, dampers 525 located at the base of the chamber may be used to adjust the flow of air. In some embodiments, the dampers may include one or more valves, or plates configured to control, stop, or regulate the flow of air inside chamber 600. In some embodiments, one or more dampers may be manual (e.g., using a manual handle to control the damper), or automatic (e.g., using motors 526 that are controlled by a thermostat).

In some embodiments, different rack-mounted computing devices may obstruct air differently, potentially leading to areas of high flow and other areas of low flow. The low flow areas may not be adequately cooled. To mitigate this issue, chamber 600 may include baffles (or other structures that impede airflow through a surface, like filters and plates with arrays of holes) surrounding (e.g., adjacent and defining) the interior chamber. These structures are expected to make airflow more uniform within chamber 600 (e.g., for cooling, ventilation, heat exchange, etc.) For example, the airflow restrictions may make airflow more uniform into or out of the chamber. In some cases, the airflow restrictions may uniformly constrain airflow over a surface and, thereby, account for a substantial portion of the pressure drop between the interior and exterior of the chamber. As a result, it is expected that computing-device specific differences in the pressure drop will account for a smaller portion of the total pressure drop, thereby evening fluid flow. In some embodiments, the airflow restrictors may be in the form of vanes, panels, orifices, or other forms. In some embodiments, the baffles may be one or more of longitudinal, horizontal, or other type of baffles.

Figure 4:
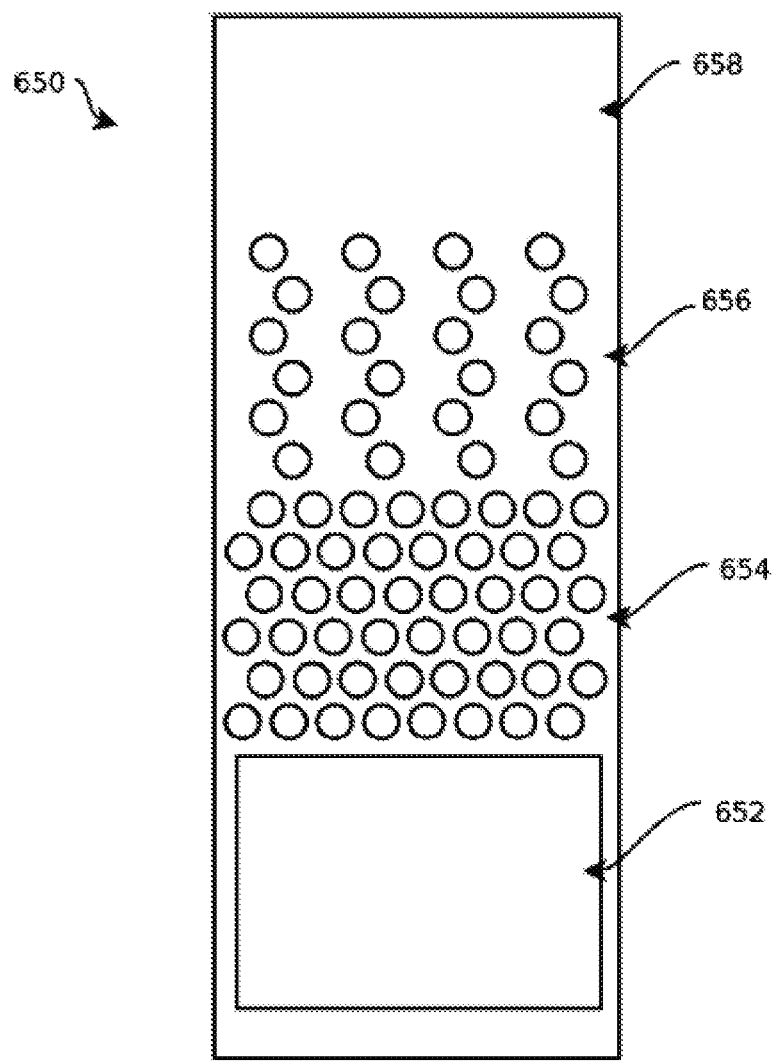
FIG. 4 illustrates an example of a spatially modulated airflow restrictor in the rack of FIG. 1.

In some embodiments, airflow restrictors may include spatially modulated airflow restrictors configured expected to reduce the likelihood of positive pressure developing in the interior chamber, thereby preventing hot air from flowing back from the interior chamber towards the computing equipment. An example of a spatially modulated airflow restrictor 650 is shown in FIG. 4. The airflow restrictor 650 may be disposed against a back-side of each server rack 605, between the server rack and the interior chamber. In some cases, a ring of the airflow restrictors, placed edge-to-edge, with one behind each server rack 605, may define the interior chamber. Some embodiments may include a region 652 with relatively little restriction, e.g., at an upstream end of the interior chamber, for instance with totally unobstructed airflow. In some cases, the upstream end may be near the bottom of the interior chamber, e.g., when hot air is exhausted through the interior chamber and out through the top of the interior chamber. An adjacent region 654 may further restrict airflow, while generally providing a uniform amount of airflow over the area of region 654, e.g., with an array of holes in a plate. Further upstream along the interior chamber, a region 656 may restrict airflow even more, again while generally providing a uniform amount of airflow over the area of region 656. Finally, a region 658 may fully restrict airflow. In some embodiment, each rack may have an instance of spatially modulated airflow restrictor 650 disposed adjacent a back side of the rack, between the rack and the interior chamber. In some embodiments, restrictor 650 may be planar, or restrictor 650 may be curved. In some embodiments, the airflow restrictions may be arrays of holes (e.g., circular holes, or other shapes). In some embodiments, the airflow restrictions are wire mesh or air filters. In some embodiments, the airflow restrictors are stacked, offset baffles, providing a tortuous path. In some embodiments, the airflow restrictors are identical, but with additional layers of airflow restrictors provided in areas of greater restriction. In some embodiments, the restrictor may be a steel plate, e.g., a laser cut steel plate of less than 5 millimeter thickness.

In some embodiments, the amount of airflow restriction may be adjustable in the different portions. For instance, over each portion, another instance of the segment of the plate may be mounted with a bolt extending through a slot in the restrictor 650, and the second plate may be translated side-to-side to adjust the amount of each hole that remains open to airflow, thereby permitting further tuning of airflow. In some embodiments, the airflow restrictors may be capable of being closed manually (e.g., using a manual handle to adjust a plate to close the airflow restrictors), or automatic (e.g., using motors that are controlled by a thermostat).

In some embodiments, heated air in the interior chamber may be driven up to the top of the interior chamber and out of the chamber by differences in pressure. In some embodiment, the heated air may be pushed to the top of the interior chamber. For example by a fan (or blower, or a pump) located in a bottom portion of the interior chamber. The fan (or blower, or a pump) may be located in fluid communication with the interior chamber, e.g., inside the interior chamber. In some cases, more than one fan may be used, for example, a fan at each equipment tray holding computing devices. In some cases, the heated air is directed outside of the chamber through an exhaust vent 622 located on top of the chamber 600 (FIGS. 1-2). In some embodiments, a lid (e.g., lid 630 of FIG. 3) configured to cover the top of the chamber serves as a barrier that prevents the hot air from mixing back in with the cold air. In some embodiments, a fan 624 (or an array of fans) may be arranged and positioned in the top of the lid and configured to pull the hot air upward.

In some cases, fan 624 may be configured to pull the hot air into ductwork that routes the air elsewhere. For example, ducting may be coupled to the interior chamber, and air may flow through the ducting to a region at a lower pressure, in these cases, the ducting may be connected to a second fan configured to be controlled with the same controller that controls fan 624 to create redundancy inside and outside of the chamber. In some embodiments, exhaust vent 622 may be connected to a cooling system that is configured to cool the heated air and re-inject it into the chamber as cool air to flow circumferentially inward.

In some embodiments, the interior chamber may be connected to a source of cool air (e.g., a cooling system, building's HVAC, etc.). Cool air (or other cooling fluids) may be directed (by any mechanism, e.g., mechanisms described above) to flow circumferentially outward from the interior chamber along and through computing devices mounted in the racks of chamber 600. The cool air flows through the racks, along and through equipment on the racks. In some embodiments, the air flows from all directions of the cylindrical shaped chamber and is pushed from the interior chamber through the racks and equipment on the racks towards an outer surface of the chamber. The incoming cool air from the interior chamber is heated as it passes across heatsinks and other warm components inside the equipment, in these embodiments.

In some embodiments, a fan located on the top or the bottom of the interior chamber (as described above) and configured to move air (cool and/or heated) in and out of the chamber. For example, a fan located on the top may be configured to direct heated air outside of the chamber; a fan located in the bottom of the chamber may be configured to push heated air up and outside of the chamber. In some embodiments, a fan located in the bottom or in any other location within the interior chamber may be configured to move cool air (or cooling fluid) from the interior chamber to flow circumferentially outward and outside of the chamber.

In some embodiments, one or more fans located within the interior chamber may be configured to drive the heated air in the interior chamber outside by following a flow path defined by the cylindrical interior chamber and pushed up through the exit on the top of the chamber. In some embodiments, the fans may be configured to move the air (or fluid) in different directions (e.g., vertically, horizontally, diagonally, upward, downward, sideways, etc.) The fans may have a diameter that is smaller than the inner diameter of the chamber to allow for back access to equipment. In some embodiments, the fans may be mounted on one or more rack trays. In some embodiments, chamber racks may be connected to each other, from the back side toward the interior chamber, by one or more fans (the fans being connected to trays on a same level in the computer racks). In some embodiments, the one or more fans may be independent of the chamber. In this case, the fans may be removably placed in the space within the interior chamber without being physically connected to the chamber. Fans with same size or different size may be used. In some embodiments, larger, slower-turning fans may be quieter than smaller, faster fans that can move the same airflow.

Airflow of the one or more fans may be determined by the speed of rotation (or rotational velocity) and/or static pressure of the fans. In some cases, fans with relatively high static pressure may be more effective at forcing air through restricted spaces, such as between fins of heatsinks.

In some embodiments, fan 624 (and/or other fans) may be a revolving blade fan. For example, an axial fan configured to force air to move parallel to the shaft about which the blades rotate. In some cases, for more pressure, a centrifugal fan may be used. An impeller in the fan may cause air to enter the fan near the shaft and move perpendicularly from the shaft to the opening in the opening of the fan causing air to blow at right angles to the intake of the fan. In some embodiments, a crossflow fan may be used for its ability to adjust in length and diameter to fit the space in the interior chamber and for its high pressure coefficient. In some embodiments, fans with no exposed fan blades may be used. In these cases, the fan includes an oscillating and tilting head, and does not have moving blades. Instead, in some cases, the fan includes a high-pressure-bladed impeller fan that drives the air. These are just examples of fans that can be used with the current techniques, other types of fans may be suitable for these techniques.

The fans may be driven by motors, in some cases with a different motor for each fan, and in some cases, with fans sharing a motor, or with multiple motors per fan. In some embodiments, the fans may be powered by electric motors. A motor may be directly attached to the fan (e.g., in fan center, or behind it). In some cases, the motor may be configured to drive the fan through a belt or other gear. The motor driving the fan may be a shaded pole alternative current (AC) motor, brushed direct current (DC) motor, brushless DC motor, or other types of motors.

In some cases, the one or more fans may be selectively mechanically coupled to one or more motors via one or more clutches. In some embodiments, one fan may be driven by more than one motor. The motors may be arranged such that each can drive the fan with equal force (e.g., approximately equal, like within plus or minus 10%), and such that only one motor is engaged to the fan at a time. The one or more clutches are configured to engage and disengage (disable) the one or more motors thereby powering the motor on or off, and in some cases, controlling the amount of torque delivered by the motor. Examples of clutches may include friction clutches, single revolution clutches, belt clutches, hydraulic clutches, and electromagnetic clutches.

In some embodiments, the fan is monitored for proper operation by comparing its rotational velocity or airflow to an acceptable range of values. A variety of sensors may provide data indicative of fan performance. Examples include rotational velocity sensors of fans, pitot tubes for sensing airflow, thermocouples for sensing temperature, or pressure sensors. In some cases, the fans may be controlled such that their speed may be reduced when temperature is not above a threshold for example. This may result in quieter operations, longer life, and lower power consumption.

A variety of different control routes may be executed. In some cases, if the fan's output falls below a minimum threshold for proper operation, the clutch for the motor driving the fan is disabled and power to that motor is turned off. The next motor in line gets its clutch enabled and is powered up. This failover process may continue and, in some cases, can loop back to the first motor as the last motor fails. In some cases, before transition to the next motor in line is made, the next motor in line is brought up to the same speed as the motor being disabled for a smooth transition.

In a proper design taking advantage of this invention (of the several inventions described herein), replacement of the failed motors in a live system is possible. For example, if a motor fails, the failed motor can be removed, or replaced without stopping rotation being driven by another motor. This allows for safe and reliable cooling for critical applications for indefinite periods of time with minimal interruptions due to maintenance.

In some embodiments, for example a controller may be configured to enable a first clutch associated with a first motor to drive the fan. Rotational velocity of the fan being driven by the first motor may be compared to a range (e.g., a predetermined or dynamically determined range) of rotational velocity values. In some cases, airflow may be compared to a range of airflow values. One or more sensors may be used to measure one or more parameters related to air (or fluid flow) such as temperature, airflow, density, pressure, or other parameters. In some cases, sensors may measure one or more parameters related to the fan, motors, clutches, and or other component within or outside of the chamber. The first clutch associated with the first motor may be disabled responsive to the rotational velocity of the fan being outside of the range. For example, above or below the range. The first clutch may be disabled at the time, before or after the rotational velocity is outside of the range. A second clutch associated with a second motor may be enabled allowing the second motor to drive the fan. In some cases, the second clutch associated with the second motor may be disabled responsive to the rotational velocity of the fan being outside of the range. In some cases, a third clutch associated with a third motor may be enabled allowing the third motor to drive the fan. A last clutch, of the one or more clutches, associated with a last motor may be disabled responsive to the rotational velocity of the fan when driven by the last motor being outside of the range, and the first clutch associated with the first motor may be enabled to allow the first motor to drive the fan.

The clutches may be enabled and disabled at different sequences (first, third, last, first; or second, third, fourth, second; etc.) In some cases, not all the clutches will be enabled before the first one is enabled. In some embodiments, more than one clutch may be enabled or disabled at a time (e.g., to allow for more than one motor to drive the fan). In some embodiments, more than one fan can be used. In these cases, for example, one or more fans may be enabled or disabled through respective motors and clutches (or with other mechanisms to enable and disable the fans). In some embodiments, a controller may be configured to control operations of the clutches.

The controller may compare sensed values to target values and modulate fan operation, e.g., based on an amount of difference between the values. For example a proportional-integral-derivative (PID) controller, or other type of feedback controller, or an open loop feed-forward controller may be used. In some cases, the fans may be controlled such that their speed may be reduced when temperature is not above a threshold, for example. This may result in quieter operations, longer life, and lower power consumption.

Figure 5:
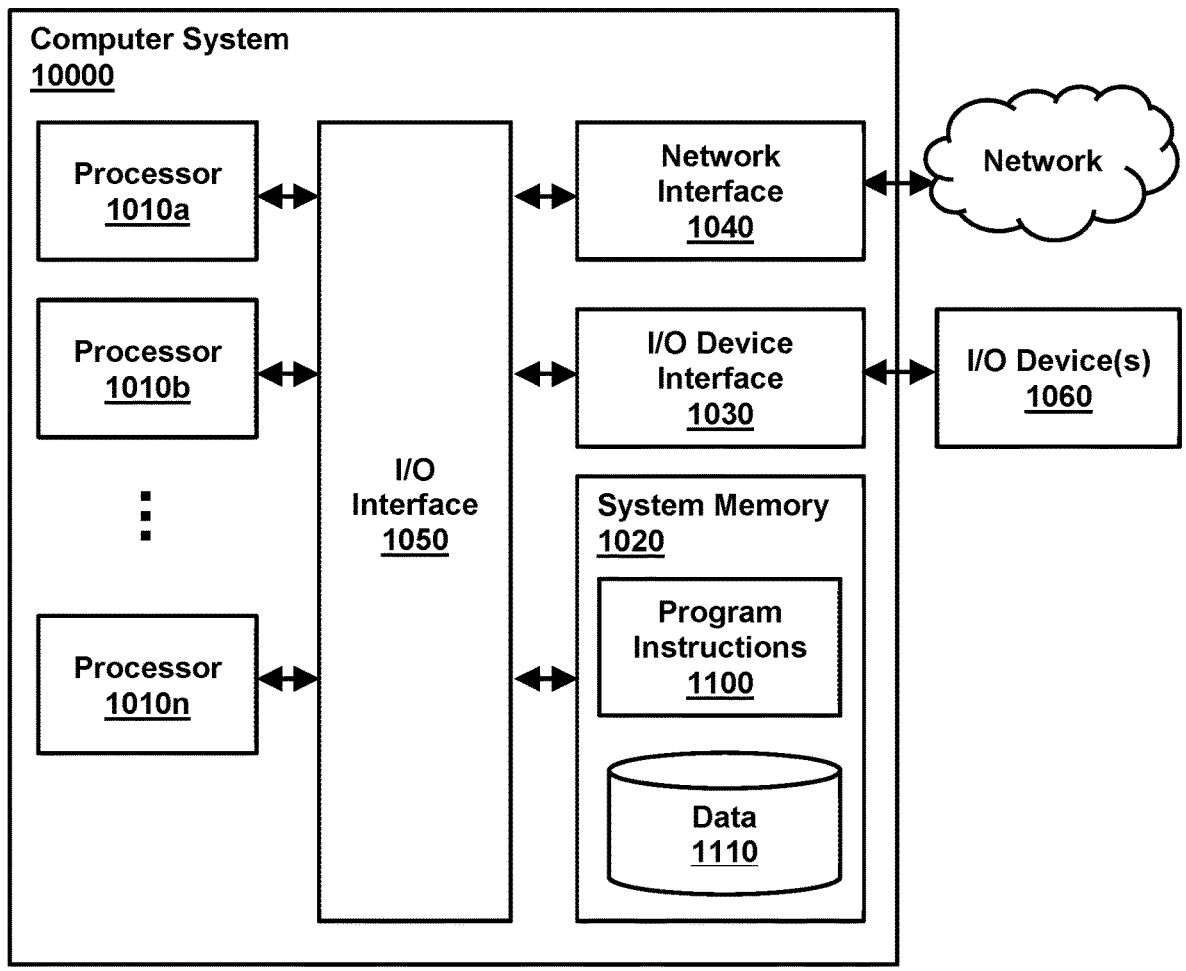
FIG. 5 illustrates components of a computing device that may be disposed and interconnected in the cylindrical computing-device rack of FIG. 1.

FIG. 5 is a diagram that illustrates an exemplary computing system 1000 in accordance with embodiments of the present technique. In some cases, a relatively large number of instances of the system 1000 may be housed in the chamber 600, e.g., more than 10, more than 20, or more than 50. Various portions of systems and methods described herein, may include or be executed on one or more computer systems similar to computing system 1000. Further, processes and modules described herein may be executed by one or more processing systems similar to that of computing system 1000.

Computing system 1000 may include one or more processors (e.g., processors 1010a-1010n) coupled to system memory 1020, an input/output I/O device interface 1030, and a network interface 1040 via an input/output (I/O) interface 1050. A processor may include a single processor or a plurality of processors (e.g., distributed processors). A processor may be any suitable processor capable of executing or otherwise performing instructions. A processor may include a central processing unit (CPU) that carries out program instructions to perform the arithmetical, logical, and input/output operations of computing system 1000. A processor may execute code (e.g., processor firmware, a protocol stack, a database management system, an operating system, or a combination thereof) that creates an execution environment for program instructions. A processor may include a programmable processor. A processor may include general or special purpose microprocessors. A processor may receive instructions and data from a memory (e.g., system memory 1020). Computing system 1000 may be a uni-processor system including one processor (e.g., processor 1010a), or a multi-processor system including any number of suitable processors (e.g., 1010a-1010n). Multiple processors may be employed to provide for parallel or sequential execution of one or more portions of the techniques described herein. Processes, such as logic flows, described herein may be performed by one or more programmable processors executing one or more computer programs to perform functions by operating on input data and generating corresponding output. Processes described herein may be performed by, and apparatus can also be implemented as, special purpose logic circuitry, e.g., an FPGA (field programmable gate array) or an ASIC (application specific integrated circuit). Computing system 1000 may include a plurality of computing devices (e.g., distributed computer systems) to implement various processing functions.

I/O device interface 1030 may provide an interface for connection of one or more I/O devices 1060 to computer system 1000. I/O devices may include devices that receive input (e.g., from a user) or output information (e.g., to a user). I/O devices 1060 may include, for example, graphical user interface presented on displays (e.g., a cathode ray tube (CRT) or liquid crystal display (LCD) monitor), pointing devices (e.g., a computer mouse or trackball), keyboards, keypads, touchpads, scanning devices, voice recognition devices, gesture recognition devices, printers, audio speakers, microphones, cameras, or the like. I/O devices 1060 may be connected to computer system 1000 through a wired or wireless connection. I/O devices 1060 may be connected to computer system 1000 from a remote location. I/O devices 1060 located on remote computer system, for example, may be connected to computer system 1000 via a network and network interface 1040.

Network interface 1040 may include a network adapter that provides for connection of computer system 1000 to a network. Network interface may 1040 may facilitate data exchange between computer system 1000 and other devices connected to the network. Network interface 1040 may support wired or wireless communication. The network may include an electronic communication network, such as the Internet, a local area network (LAN), a wide area network (WAN), a cellular communications network, or the like.

System memory 1020 may be configured to store program instructions 1100 or data 1110. Program instructions 1100 may be executable by a processor (e.g., one or more of processors 1010a-1010n) to implement one or more embodiments of the present techniques. Instructions 1100 may include modules of computer program instructions for implementing one or more techniques described herein with regard to various processing modules. Program instructions may include a computer program (which in certain forms is known as a program, software, software application, script, or code). A computer program may be written in a programming language, including compiled or interpreted languages, or declarative or procedural languages. A computer program may include a unit suitable for use in a computing environment, including as a stand-alone program, a module, a component, or a subroutine. A computer program may or may not correspond to a file in a file system. A program may be stored in a portion of a file that holds other programs or data (e.g., one or more scripts stored in a markup language document), in a single file dedicated to the program in question, or in multiple coordinated files (e.g., files that store one or more modules, sub programs, or portions of code). A computer program may be deployed to be executed on one or more computer processors located locally at one site or distributed across multiple remote sites and interconnected by a communication network.

System memory 1020 may include a tangible program carrier having program instructions stored thereon. A tangible program carrier may include a non-transitory computer readable storage medium. A non-transitory computer readable storage medium may include a machine readable storage device, a machine readable storage substrate, a memory device, or any combination thereof. Non-transitory computer readable storage medium may include non-volatile memory (e.g., flash memory, ROM, PROM, EPROM, EEPROM memory), volatile memory (e.g., random access memory (RAM), static random access memory (SRAM), synchronous dynamic RAM (SDRAM)), bulk storage memory (e.g., CD-ROM and/or DVD-ROM, hard-drives), or the like. System memory 1020 may include a non-transitory computer readable storage medium that may have program instructions stored thereon that are executable by a computer processor (e.g., one or more of processors 1010a-1010n) to cause the subject matter and the functional operations described herein. A memory (e.g., system memory 1020) may include a single memory device and/or a plurality of memory devices (e.g., distributed memory devices).

I/O interface 1050 may be configured to coordinate I/O traffic between processors 1010a-1010n, system memory 1020, network interface 1040, I/O devices 1060, and/or other peripheral devices. I/O interface 1050 may perform protocol, timing, or other data transformations to convert data signals from one component (e.g., system memory 1020) into a format suitable for use by another component (e.g., processors 1010a-1010n). I/O interface 1050 may include support for devices attached through various types of peripheral buses, such as a variant of the Peripheral Component Interconnect (PCI) bus standard or the Universal Serial Bus (USB) standard.

Embodiments of the techniques described herein may be implemented using a single instance of computer system 1000 or multiple computer systems 1000 configured to host different portions or instances of embodiments. Multiple computer systems 1000 may provide for parallel or sequential processing/execution of one or more portions of the techniques described herein.

Those skilled in the art will appreciate that computer system 1000 is merely illustrative and is not intended to limit the scope of the techniques described herein. Computer system 1000 may include any combination of devices or software that may perform or otherwise provide for the performance of the techniques described herein. For example, computer system 1000 may include or be a combination of a cloud-computing system, a data center, a server rack, a server, a virtual server, a desktop computer, a laptop computer, a tablet computer, a server device, a client device, a mobile telephone, a personal digital assistant (PDA), a mobile audio or video player, a game console, a vehicle-mounted computer, or a Global Positioning System (GPS), or the like. Computer system 1000 may also be connected to other devices that are not illustrated, or may operate as a stand-alone system. In addition, the functionality provided by the illustrated components may in some embodiments be combined in fewer components or distributed in additional components. Similarly, in some embodiments, the functionality of some of the illustrated components may not be provided or other additional functionality may be available.

Those skilled in the art will also appreciate that while various items are illustrated as being stored in memory or on storage while being used, these items or portions of them may be transferred between memory and other storage devices for purposes of memory management and data integrity. Alternatively, in other embodiments some or all of the software components may execute in memory on another device and communicate with the illustrated computer system via inter-computer communication. Some or all of the system components or data structures may also be stored (e.g., as instructions or structured data) on a computer-accessible medium or a portable article to be read by an appropriate drive, various examples of which are described above. In some embodiments, instructions stored on a computer-accessible medium separate from computer system 1000 may be transmitted to computer system 1000 via transmission media or signals such as electrical, electromagnetic, or digital signals, conveyed via a communication medium such as a network or a wireless link. Various embodiments may further include receiving, sending, or storing instructions or data implemented in accordance with the foregoing description upon a computer-accessible medium. Accordingly, the present invention may be practiced with other computer system configurations.

In block diagrams, illustrated components are depicted as discrete functional blocks, but embodiments are not limited to systems in which the functionality described herein is organized as illustrated. The functionality provided by each of the components may be provided by software or hardware modules that are differently organized than is presently depicted, for example such software or hardware may be intermingled, conjoined, replicated, broken up, distributed (e.g. within a data center or geographically), or otherwise differently organized. The functionality described herein may be provided by one or more processors of one or more computers executing code stored on a tangible, non-transitory, machine readable medium. In some cases, third party content delivery networks may host some or all of the information conveyed over networks, in which case, to the extent information (e.g., content) is said to be supplied or otherwise provided, the information may provided by sending instructions to retrieve that information from a content delivery network.

The reader should appreciate that the present application describes several inventions. Rather than separating those inventions into multiple isolated patent applications, applicants have grouped these inventions into a single document because their related subject matter lends itself to economies in the application process. But the distinct advantages and aspects of such inventions should not be conflated. In some cases, embodiments address all of the deficiencies noted herein, but it should be understood that the inventions are independently useful, and some embodiments address only a subset of such problems or offer other, unmentioned benefits that will be apparent to those of skill in the art reviewing the present disclosure. Due to costs constraints, some inventions disclosed herein may not be presently claimed and may be claimed in later filings, such as continuation applications or by amending the present claims. Similarly, due to space constraints, neither the Abstract nor the Summary of the Invention sections of the present document should be taken as containing a comprehensive listing of all such inventions or all aspects of such inventions.

It should be understood that the description and the drawings are not intended to limit the invention to the particular form disclosed, but to the contrary, the intention is to cover all modifications, equivalents, and alternatives falling within the spirit and scope of the present invention as defined by the appended claims. Further modifications and alternative embodiments of various aspects of the invention will be apparent to those skilled in the art in view of this description. Accordingly, this description and the drawings are to be construed as illustrative only and are for the purpose of teaching those skilled in the art the general manner of carrying out the invention. It is to be understood that the forms of the invention shown and described herein are to be taken as examples of embodiments. Elements and materials may be substituted for those illustrated and described herein, parts and processes may be reversed or omitted, and certain features of the invention may be utilized independently, all as would be apparent to one skilled in the art after having the benefit of this description of the invention. Changes may be made in the elements described herein without departing from the spirit and scope of the invention as described in the following claims. Headings used herein are for organizational purposes only and are not meant to be used to limit the scope of the description.

As used throughout this application, the word "may" is used in a permissive sense (i.e., meaning having the potential to), rather than the mandatory sense (i.e., meaning must). The words "include", "including", and "includes" and the like mean including, but not limited to. As used throughout this application, the singular forms "a," "an," and "the" include plural referents unless the content explicitly indicates otherwise. Thus, for example, reference to "an element" or "a element" includes a combination of two or more elements, notwithstanding use of other terms and phrases for one or more elements, such as "one or more." The term "or" is, unless indicated otherwise, non-exclusive, i.e., encompassing both "and" and "or." Terms describing conditional relationships, e.g., "in response to X, Y," "upon X, Y,", "if X, Y," "when X, Y," and the like, encompass causal relationships in which the antecedent is a necessary causal condition, the antecedent is a sufficient causal condition, or the antecedent is a contributory causal condition of the consequent, e.g., "state X occurs upon condition Y obtaining" is generic to "X occurs solely upon Y" and "X occurs upon Y and Z." Such conditional relationships are not limited to consequences that instantly follow the antecedent obtaining, as some consequences may be delayed, and in conditional statements, antecedents are connected to their consequents, e.g., the antecedent is relevant to the likelihood of the consequent occurring. Statements in which a plurality of attributes or functions are mapped to a plurality of objects (e.g., one or more processors performing steps A, B, C, and D) encompasses both all such attributes or functions being mapped to all such objects and subsets of the attributes or functions being mapped to subsets of the attributes or functions (e.g., both all processors each performing steps A-D, and a case in which processor 1 performs step A, processor 2 performs step B and part of step C, and processor 3 performs part of step C and step D), unless otherwise indicated. Further, unless otherwise indicated, statements that one value or action is "based on" another condition or value encompass both instances in which the condition or value is the sole factor and instances in which the condition or value is one factor among a plurality of factors. Unless specifically stated otherwise, as apparent from the discussion, it is appreciated that throughout this specification discussions utilizing terms such as "processing," "computing," "calculating," "determining" or the like refer to actions or processes of a specific apparatus, such as a special purpose computer or a similar special purpose electronic processing/computing device.

The present techniques will be better understood with reference to the following enumerated embodiments:

1. A method of cooling rack-mounted computing devices, the method comprising: conducting a cooling fluid, at a first temperature and a first pressure, through an outer perimeter of three or more racks, wherein the racks are arranged facing at least three different directions to define an interior chamber disposed on an opposite side of the racks from the outer perimeter; conducting the cooling fluid through the racks and in contact with heat-generating computing components within the racks such that the temperature of the cooling fluid increases and heat is removed from the computing components; and conducting the cooling fluid through the interior chamber at a second temperature and a second pressure in a direction that is generally orthogonal to the direction the cooling fluid flows when conducting the cooling fluid through the racks.

2. The method of embodiment 1, wherein the interior chamber is upstream of the outer perimeter, the first pressure is higher than the second pressure, and the first temperature is lower than the second temperature.

3. The method of any of embodiments 1-2, wherein an exhaust vent is located on a top side of the interior chamber, and wherein the cooling fluid is directed to exit the interior chamber through the exhaust vent, the method comprising performing steps for spatially modulating airflow restrictions.

4. The method of any of embodiments 1-3, wherein the chamber comprises a fan, one or more motors configured to individually drive the fan, the motors being coupled to the fan via one or more clutches, and a controller, the method further comprising: engaging a first clutch mechanically coupleable to a first motor to drive the fan; measuring a rotational velocity of the fan; comparing the rotational velocity of the fan to a threshold rotational velocity value; disabling the first clutch associated with the first motor responsive to the rotational velocity satisfying the threshold; and engaging a second clutch mechanically coupleable to a second motor to drive the fan.

5. The method of embodiment 4, further comprising: disabling the second clutch associated with the second motor responsive to the rotational velocity of the fan satisfying the threshold; and engaging a third clutch mechanically coupleable to a third motor to drive the fan.

6. The method of any of embodiments 4-5, further comprising: disabling a last clutch mechanically coupleable to a last motor responsive to the rotational velocity of the fan satisfying the threshold; and engaging the first clutch associated with the first motor to drive the fan.

7. The method of any of embodiments 4-6, wherein the one or more clutches are configured to drive the fan with substantially equal torque.

8. The method of any of embodiments 4-7, further comprising, estimating airflow within the chamber and wherein the engaging and disabling operations are further based on comparing the airflow to a, airflow range.

9. A system configured for cooling rack-mounted computing devices, the system comprising: a plurality of racks arranged such that the back sides of the racks define an interior of a chamber, the interior of the chamber being of cylindrical shape; and a spatially modulated airflow restrictor configured to restrict airflow to or from the interior chamber, wherein the airflow restrictor imposes less restriction on airflow entering the interior chamber in a first portion of the interior chamber relative to airflow entering a second portion of the interior chamber, the first portion being upstream of the second portion along an airflow through the interior chamber.

10. The system of claim 9, comprising a first fan motor and a second fan motor driving one or more fans in fluid communication with the interior chamber, wherein the first fan motor and second fan motor are hot swappable.

11. The system of claim 9, comprising means for creating a pressure differential between the interior chamber and the exterior of the chamber.

12. A cooling system for cooling a data center chamber, the cooling system comprising: a fan; one or more motors configured to drive the fan, the motors being coupled to the fan via respective clutches; and a controller configured to perform operations comprising: engage a first clutch mechanically coupleable to a first motor to drive the fan; measure rotational velocity of the fan; compare a rotational velocity of the fan to a range of rotational velocity values; disable the first clutch associated with the first motor responsive to the rotational velocity being outside of the range; and engage a second clutch mechanically coupleable to a second motor to drive the fan.

13. The system of embodiment 12, wherein the operations comprise disable the second clutch associated with the second motor responsive to the rotational velocity of the fan being outside of the range; and engage a third clutch mechanically coupleable to a third motor to drive the fan.

14. The system of any of embodiments 12-13, wherein the operations comprise: disable a last clutch, mechanically coupleable to a last motor responsive to the rotational velocity of the fan being outside of the range; an engage the first clutch associated with the first motor to drive the fan.

15. The system of any of embodiments 12-14, wherein the one or more clutches are configured to drive the fan with equal torque.

16. The system of any of embodiments 12-15, further comprising: an airflow sensor configured to output signals conveying information related to airflow within the chamber, wherein the controller is further configured to calculate airflow within the chamber based on the output signals, and wherein the engaging and disabling operations are further based on comparing the airflow to a pre-determined airflow range.

17. The system of any of embodiments 12-16, wherein an exhaust vent is located on a top side of the interior chamber, and wherein the cooling fluid is directed to exit the interior chamber through the exhaust vent.

18. The system of any of embodiments 12-17, wherein the chamber comprises multiple computing devices and wherein the cooling system is configured to cool components of the computing devices.

19. The system of any of embodiments 12-18, further comprising one or more sensors configured to output signals conveying information related to temperature, pressure, or humidity within the chamber.

20. The system of any of embodiments 12-19, comprising means for spatially modulating airflow into or out of the interior chamber.

For each rack, the latitude and longitude (and height or floor, in a multi-floor datacenter) may be included in the results returned, and for each component, a location triple may be returned including the vertical, horizontal and depth information received. Some embodiments may also include a depth of the tag within a rack.

Various hardware embodiments are contemplated. Various sensors may be used. For example, in some embodiments RFID tags may be used. In some embodiments, near field communications (NFC) sensors may be used. In some embodiments, other types of sensors may be used. RFIDs and RFID readers will be described in this disclosure as examples, and not to be construed as limiting. RFIDs may be used at each rack U and a low-power reader and writer may be positioned at rear of server such that when the server is mounted into the rack, the power connection closes and the RFID tag is aligned with the reader.

In some embodiments, data may be read off the RFID tag and stored in the server, or in the microcontroller for powerline interface. The data may be updated each time the server is pushed into a new location. In some cases, the data may be conveyed via the above-described power-line modem, in response to read command received via the same channel.

In some embodiments, the RFID tags may be programed at factory when the rack is made for example. In these cases the tags may include read only information. In some embodiments, the RFID tags may have an area of tag memory that is writeable. The writable data may include name of rack, name of data center, address, serial numbers, etc.

In some embodiments, writing and/or retrieving the data from the tag may be done remotely.

In some embodiments, the tag reader may be mounted at rear of the chassis of the adaptor described above with a small wire that the powerline communication modem can talk to. This will allow for the tag to be found even if the server is off. This is advantageous because it does not require mechanical/electrical interface between the tag and the reader. It is expected that electrical contact will tends to be broken and corroded and unreliable. That said, other embodiments may use such electrical contacts in conjunction with the other inventive aspects described herein. In some embodiments, the reader may be powered (about 3.3 volts) by power from the power adaptor board described above.

In some embodiments, the tag reader may include an antenna. In other embodiments, the tag reader may use an off-the shelf antenna, or in other cases a PCB trace antenna may be used as an antenna for the tag reader.

In operation, the RFID tag and the reader may be installed in various locations (e.g., back of the server, on the rails, on the rack, on the chassis of the adaptor, etc.). Air gap of about ⅛ inch to ¼ inch may be left between the tag and the reader.

In some embodiments, more centralized components, like a control unit for a rack or for a datacenter (e.g. remote management controller acting as the rack level control unit), may take inventory of the presence and location of tagged devices. For instance, an API request to such a control unit may prompt the control unit to scan for present devices. In some embodiments, a control bus, such as a dual-purpose DC power and control bus coupled to a powerline modem on each rack, may be accessed by the centralized control unit to scan for tags. In some cases, such scans may be performed periodically, e.g., less than once an hour or once a day, or more frequently.

o mitigate these issues, and others, some embodiments include the above-depicted UPS (a term which does not imply that power is never interrupted, merely that over some duration, power remains uninterrupted). In some embodiments, a higher-voltage direct current (DC) power source, such as a battery may provide electrical power that is converted into a lower voltage, higher current DC power source. Higher voltages in the battery, in some embodiments, are leveraged to generate larger currents than would otherwise be available for a battery of a given size. This technique is expected to accommodate use of relatively small batteries while delivering relatively large currents for relatively short durations.

The transformation may be effected by a DC-DC converter, such as a 48-volt to 12-volt DC-DC converter that receives 48 volt DC power at given current and produces 12-volt DC power at a substantially higher current. In some embodiments, the converter may be a switched-mode converter. In some embodiments, the converter may include a metal-oxide semiconductor field effect transistor coupled to an oscillator that periodically reverses polarity of the higher-voltage input DC power supply. In some embodiments, the converter may be a magnetic converter that includes an inverter that converts 48-volt DC current to alternative (AC) current, a transformer that steps down the voltage of the AC current, and a rectifier that converts the stepped-down AC current to a DC current. The converter may include a low-pass filter (e.g., a parallel-connected capacitor and serially connected resistor) that smooths voltage changes in the DC current at the lower voltage.

In some embodiments, the rack control unit may execute a Docker TM container that provides an endpoint for OpenDCRE™. In some cases, the end point is web server in a reverse proxy with logic that converts web requests (e.g., HTTP GET requests) exchanged via the powerline communications modem on a DC power bus for a rack, in some cases, with different racks or other subsets of rack-mounted devices in a datacenter having separate DC power buses and corresponding networks. In some embodiments, the web server supports the RESTful aspects, e.g., listening to a port, parsing received packets for application level requests, and determining appropriate action for requests encoded in the application level.

What is claimed is:

1. A cooling system comprising:
   a plurality of racks configured to receive a plurality of computers, the plurality of racks comprising:
   respective front vertical faces facing outward in at least two different directions, and
   corresponding rear vertical faces of the plurality of racks at least partially surrounding an interior chamber having a vertical axis and height;
   one or more racks of the plurality of racks comprising:
   a plurality of receptacles configured to receive a subset of the computers among the plurality of computers inserted from a corresponding one of the front vertical faces towards a corresponding one of the rear vertical faces to mate with a bus bar of a dual-purpose DC power and control bus,
   a plurality of tags configured with locational information comprising at least a vertical position of respective ones of the receptacles among the plurality of receptacles within the one or more racks, and
   wherein at least one of the computers among the subset of computers comprises a tag reader configured to wirelessly obtain respective locational information from a given tag among the plurality of tags of a given receptacle among the plurality of receptacles having received the at least one of the computers and transmit, over the dual-purpose DC power and control bus of the one or more racks, data indicative of the respective locational information to report a vertical position of the at least one of the computers among the plurality of computers within the one or more racks, wherein:
   the dual-purpose DC power and control bus comprises a converter, wherein the converter is configured to reduce voltage change using a low-pass filter;
   means for driving a flow of a cooling fluid to cool the computers in the at least some receptacles among the plurality of receptacles, the means for driving the flow of the cooling fluid being configured to direct the cooling fluid from the front vertical face to the rear vertical face of at least a first one of the plurality of racks and into the interior chamber; and
   a fluid-flow restrictor configured to modulate flow of the cooling fluid through the interior chamber, the fluid-flow restrictor having a first setting configured to substantially prevent flow of the cooling fluid therethrough independent of operation of the means for driving the first flow and a second setting configured to substantially permit the flow of the cooling fluid therethrough at least partially dependent on operation of the means for driving the first flow.

2. The cooling system of claim 1, wherein:
   the fluid-flow restrictor is disposed along the rear vertical face of the first one of the plurality of racks defining a portion of the interior chamber and is configured to modulate the flow of the cooling fluid through the interior chamber by restricting or permitting the flow of the cooling fluid.

3. The cooling system of claim 1, wherein:
   the fluid-flow restrictor is configured to modulate the flow of the cooling fluid through the interior chamber by restricting or permitting the flow of the cooling fluid into the interior chamber, the flow of cooling fluid being directed from the front vertical face of at least the first one of the plurality of racks into the interior chamber.

4. The cooling system of claim 1, comprising another fluid-flow restrictor, wherein:
   the fluid-flow restrictor is disposed along the rear vertical face of the first one of the plurality of racks defining a portion of the interior chamber and is configured to modulate the flow of the cooling fluid through the interior chamber by restricting or permitting the flow of the cooling fluid into the interior chamber; and
   the other fluid-flow restrictor is disposed at a base of the interior chamber and the first one of the plurality of racks and is configured to modulate the flow of the cooling fluid through the interior chamber by restricting or permitting the flow of the cooling fluid into the interior chamber, the flow of cooling fluid being directed from the front vertical face of the first one of the plurality of racks into the interior chamber.

5. The cooling system of claim 1, comprising:
   a sensor configured to receive input and generate a control signal in response to the input.

6. The cooling system of claim 5, wherein the sensor is a thermostat and the input is a temperature.

7. The cooling system of claim 1, further comprising an exhaust vent located on a top side of the interior chamber, the flow of the cooling fluid directed to exit the interior chamber through the exhaust vent, wherein:
   a second fluid-flow restrictor configured to modulate the flow of the cooling fluid through the interior chamber is a spatially modulated fluid-flow restrictor, comprising:
   a first restriction region on the flow of the cooling fluid therethrough into a first portion of the interior chamber; and a second restriction region on the flow of the cooling fluid therethrough into a second portion of the interior chamber, the first restriction region being less restrictive to flow than the second restriction region and the first portion being upstream of the second portion along the flow of the cooling fluid through the interior chamber; and wherein, the spatially modulated fluid-flow restrictor comprises a third setting by which the first restriction region and the second restriction region substantially prevent the flow of the cooling fluid therethrough into the interior chamber.

8. The cooling system of claim 1, wherein a second fluid-flow restrictor is configured to modulate the flow of the cooling fluid through the interior chamber is a spatially modulated fluid-flow restrictor, comprising:

a first restriction region on the flow of the cooling fluid therethrough in the rear vertical face of the first one of the plurality of racks into a first portion of the interior chamber when the spatially modulated fluid-flow restrictor is in a substantially open position; and a second restriction region on the flow of the cooling fluid therethrough in the rear vertical face of the first one of the plurality of racks into a second portion of the interior chamber when the spatially modulated fluid-flow restrictor is in the substantially open position, the first restriction region being less restrictive to the flow than the second restriction region and the first portion being upstream of the second portion along the flow of the cooling fluid through the interior chamber; and wherein, when the spatially modulated fluid-flow restrictor is in a substantially closed position, the first restriction region and the second restriction region substantially prevent the flow of the cooling fluid therethrough into the interior chamber.

9. The cooling system of claim 1, wherein:

the fluid-flow restrictor is configured to modulate an interior flow of the cooling fluid through the interior chamber by restricting or permitting a first portion of the flow of the cooling fluid into the interior chamber;

a second fluid-flow restrictor is configured to modulate the interior flow of the cooling fluid through the interior chamber by restricting or permitting a second portion of the flow of the cooling fluid into the interior chamber, the second portion of the flow of cooling fluid directed from the front face of at least the first one of the plurality of racks into the interior chamber to cool the computer in the receptacle and the other computers of the plurality of computers in other ones of the at least some receptacles, wherein:

the tag of the receptacle of the computer is a radio-frequency identification (RFID) tag, wherein obtaining the locational information of the computer comprises sensing, with the tag reader of the computer, a radio frequency signal transmitted by the RFID tag encoding one or more values corresponding to the locational information and a unique identifier of the RFID tag, the tag reader receives power from the dual-purpose DC power and control bus when the computer is inserted into the receptacle to close a connection between the dual-purpose DC power and control bus and the computer, the tag reader is aligned with the tag when the computer is inserted into the receptacle, the tag reader is configured to transmit the data indicative of the locational information obtained from the tag with which the tag reader is aligned to a controller of the rack, the controller of the rack is configured to obtain, via the dual-purpose DC power and control bus, via a powerline modem in response to an API request, the data indicative of the location information from the tag reader of the computer and other computers of the subset of computers inserted in other receptacles, the controller generates an inventory of a presence and location of the plurality of computers with the first one of the plurality of racks in the at least some receptacles, and the dual-purpose DC power and control bus of the rack is a rack-specific side-channel control network distinct from a network by which data is conveyed to and from the plurality of computers for performing functions.

10. The cooling system of claim 1, wherein:

the tag reader receives power from the dual-purpose DC power and control bus when the computer is inserted into the receptacle to close a connection between the dual-purpose DC power and control bus and the computer, and the tag reader is aligned with the tag when the computer is inserted into the receptacle.

11. The cooling system of claim 1, wherein:

the tag reader is configured to receive power from the dual-purpose DC power and control bus when the computer is inserted into the receptacle to close a connection between the dual-purpose DC power and control bus and the computer, the tag reader is aligned with the tag when the computer is inserted into the receptacle, and the tag reader is configured to transmit the data indicative of the locational information obtained from the tag with which the tag reader is aligned to a controller of the rack.

12. The cooling system of claim 11, wherein:

the controller of the rack is configured to obtain, via the dual-purpose DC power and control bus, via a powerline modem in response to an API request, the data indicative of the location information from the tag reader of the computer and other computers inserted in other ones of the at least some receptacles, and the controller generates an inventory of a presence and location of the plurality of computers in the at least some receptacles.

13. The cooling system of claim 1, wherein:

the dual-purpose DC power and control bus of the rack is a rack-specific side-channel control network physically distinct from a network by which data is conveyed to and from the plurality of computers for performing functions.

14. The cooling system of claim 1, wherein:

the tag reader is configured to obtain locational information periodically based on a schedule.

15. The cooling system of claim 1, wherein the converter or another converter of the dual-purpose DC power and control bus periodically reverses polarity of an input DC power.

16. A cooling system to cool computers, the cooling system comprising:

an interior chamber having a vertical axis and height;

a plurality of racks configured to receive a plurality of computers, the plurality of racks arranged to have respective front faces positioned further away from the interior chamber than respective rear faces, the rear faces disposed around a perimeter of the interior chamber;

one or more racks of the plurality of racks comprising a plurality of receptacles configured to receive the plurality of computers inserted from a corresponding one of the front vertical faces towards a corresponding one of the rear vertical faces to mate with a bus bar of a dual-purpose DC power and control bus, a plurality of tags configured with locational information comprising at least a vertical position of respective ones of the plurality of receptacles within the one or more racks and disposed within the respective receptacles, at least some of the receptacles receiving a respective computer of the plurality of computers, and wherein at least one of the computers from the plurality of computers comprises a tag reader configured to wirelessly obtain respective locational information from a tag, of the plurality of tags, of a receptacle among the plurality of receptacles having received the at least one of the computers from the plurality of computers and transmit, over the dual-purpose DC power and control bus of the one or more racks, data indicative of the respective locational information to report a vertical position of a computer, of the at least one of the computers from the plurality of computers within the one or more racks, and wherein the tag reader obtains the respective locational information periodically based on a schedule, and wherein the dual-purpose DC power and control bus comprises a converter, wherein the converter is configured to reduce voltage change using a low-pass filter;

at least one fluid moving device configured to drive a flow of a cooling fluid to cool the plurality of computers in the at least some of the receptacles, the flow of the cooling fluid directed from the front face to the rear face of at least a first one of the plurality of racks and into the interior chamber; and one or more fluid-flow restrictors configured to modulate an interior flow of the cooling fluid through the interior chamber, a first fluid-flow restrictor of the one or more fluid-flow restrictors having a first setting to substantially prevent the flow of the cooling fluid therethrough independent of operation of the at least one fluid driving device and a second setting to substantially permit the flow of the cooling fluid therethrough at least partially dependent on operation of the at least one fluid driving device.

17. The cooling system of claim 16, wherein:
the one or more fluid-flow restrictors are configured to modulate the interior flow of the cooling fluid through the interior chamber by restricting or permitting the flow of the cooling fluid into the interior chamber.

18. The cooling system of claim 16, wherein:
the one or more fluid-flow restrictors are configured to modulate the interior flow of the cooling fluid through the interior chamber by restricting or permitting the flow of the cooling fluid into the interior chamber, the flow of cooling fluid directed from the front face of at least the first one of the plurality of racks into the interior chamber.

19. The cooling system of claim 16, the one or more fluid-flow restrictors comprising at least two fluid-flow restrictors wherein:
the first fluid-flow restrictor is configured to modulate the interior flow of the cooling fluid through the interior chamber by restricting or permitting a first portion of the flow of the cooling fluid into the interior chamber; and a second fluid-flow restrictor is configured to modulate the interior flow of the cooling fluid through the interior chamber by restricting or permitting a second portion of the flow of the cooling fluid into the interior chamber, the second portion of the flow of the cooling fluid being directed from the front face of at least the first one of the plurality of racks into the interior chamber.

20. The cooling system of claim 16,
wherein the one or more fluid-flow restrictors comprises a plurality of fluid-flow restrictors, at least one fluid-flow restrictor corresponding to each rack in the plurality of racks.

21. The cooling system of claim 16, comprising:
a sensor configured to receive input and generate a control signal in response to the input.

22. The cooling system of claim 21, wherein the sensor is a thermostat and the input is a temperature.

23. The cooling system of claim 16, further comprising an exhaust vent located on a top side of the interior chamber, the interior flow of the cooling fluid directed to exit the interior chamber through the exhaust vent, wherein:
a second fluid-flow restrictor configured to modulate the interior flow of the cooling fluid through the interior chamber is a spatially modulated fluid-flow restrictor, comprising:
a first restriction position on the flow of the cooling fluid therethrough into a first portion of the interior chamber; and
a second restriction position on the flow of the cooling fluid therethrough into a second portion of the interior chamber, the first restriction position being less than the second restriction position and the first portion being upstream of the second portion along the interior flow of the cooling fluid through the interior chamber; and
wherein, the spatially modulated fluid-flow restrictor comprises a third setting by which the first restriction position and the second restriction position substantially prevent the flow of the cooling fluid therethrough into the interior chamber.

24. The cooling system of claim 16, wherein a second fluid-flow restrictor configured to modulate the interior flow of the cooling fluid through the interior chamber is a spatially modulated fluid-flow restrictor, comprising:
first restriction region on the flow of the cooling fluid therethrough along the rear face of the first one of the plurality of racks into a first portion of the interior chamber when the spatially modulated fluid-flow restrictor is in a substantially open position; and
second restriction region on the flow of the cooling fluid therethrough along the rear face of the first one of the plurality of racks into a second portion of the interior chamber when the spatially modulated fluid-flow restrictor is in the substantially open position, the first restriction region being less restrictive to the flow than the second restriction region and the first portion being upstream of the second portion along the interior flow of the cooling fluid through the interior chamber; and
wherein, when the spatially modulated fluid-flow restrictor is in a substantially closed position, the first restriction region and the second restriction region substantially prevent the flow of the cooling fluid therethrough into the interior chamber.

\* \* \* \* \*